US006487073B2

(12) United States Patent
McCullough et al.

(10) Patent No.: US 6,487,073 B2
(45) Date of Patent: Nov. 26, 2002

(54) THERMALLY CONDUCTIVE ELECTRONIC DEVICE CASE

(75) Inventors: Kevin A. McCullough, Warwick, RI (US); E. Mikhail Sagal, Watertown, MA (US); James D. Miller, Marietta, GA (US)

(73) Assignee: Cool Options, Inc., Warwick, RI (US)

(*) Notice: Subject to any disclaimer, the term of this patent is extended or adjusted under 35 U.S.C. 154(b) by 0 days.

(21) Appl. No.: 09/726,141

(22) Filed: Nov. 29, 2000

(65) Prior Publication Data

US 2002/0064024 A1 May 30, 2002

Related U.S. Application Data

(60) Provisional application No. 60/168,411, filed on Dec. 1, 1999.

(51) Int. Cl.[7] .................................................. G06F 1/20
(52) U.S. Cl. ..................... 361/687; 361/688; 361/709; 361/712
(58) Field of Search ............................. 361/688, 704, 361/709–712, 714, 717–720, 722, 687

(56) References Cited

U.S. PATENT DOCUMENTS

| | | | |
|---|---|---|---|
| 5,129,448 A | 7/1992 | Holmberg, Jr. et al. | 165/86 |
| 5,430,609 A | 7/1995 | Kikinis | 361/687 |
| 5,513,070 A | 4/1996 | Xie et al. | 361/700 |
| 5,552,960 A | 9/1996 | Nelson et al. | 361/687 |
| 5,557,500 A | 9/1996 | Baucom et al. | 361/687 |
| 5,606,341 A | 2/1997 | Aguilera | 345/87 |
| 5,621,613 A | 4/1997 | Haley et al. | 361/687 |
| 5,646,822 A | 7/1997 | Bhatia et al. | 361/687 |
| 5,666,261 A | 9/1997 | Aguilera | 361/681 |
| 5,708,566 A | 1/1998 | Hunninghaus et al. | 361/764 |
| 5,718,282 A | 2/1998 | Bhatia et al. | 165/86 |
| 5,757,615 A | 5/1998 | Donahoe et al. | 361/687 |
| 5,764,483 A | 6/1998 | Ohashi et al. | 361/699 |
| 5,781,409 A | 7/1998 | Mecredy, III | 361/687 |
| 5,790,376 A | 8/1998 | Moore | 361/700 |
| 5,796,581 A | 8/1998 | Mok | 361/687 |
| 5,818,693 A | 10/1998 | Garner et al. | 361/700 |
| 5,822,187 A | 10/1998 | Garner et al. | 361/687 |
| 5,828,552 A | 10/1998 | Ma | 361/704 |
| 5,832,987 A | 11/1998 | Lowry et al. | 165/86 |
| 6,055,158 A * | 4/2000 | Pavlovic | 361/704 |
| 6,195,267 B1 * | 2/2001 | MacDonald, Jr. et al. | 361/800 |

\* cited by examiner

*Primary Examiner*—Darren Schuberg
*Assistant Examiner*—Yean-Hsi Chang
(74) *Attorney, Agent, or Firm*—Barlow, Josephs & Holmes, Ltd.

(57) ABSTRACT

A case for dissipating heat from an electronic device is provided. The case includes an electronic circuit board with a heat generating electronic component installed thereon. A shield is positioned over the electronic component to protect it from electromagnetic interference. The shield includes an aperture through its top surface. A heat transfer conduit is molded into and through the aperture to contact the top surface of the heat generating electronic component. Outer housing, which is made of a thermally conductive material, is placed into contact with the top surface of the heat transfer conduit which extends outside the shield. As a result, heat is dissipated from the electronic component and through the housing of the electronic device via the heat transfer conduit while shielding the electronic component from electromagnetic interference.

9 Claims, 7 Drawing Sheets

THERMALLY CONDUCTIVE ELECTRONIC DEVICE CASE

This application claims the benefit of provisional application No. 60/168,411, filed Dec. 1, 1999.

BACKGROUND OF THE INVENTION

The present invention relates generally to electronic devices, integrated circuit component and cases for housing such components. More specifically, the present invention relates to apparatuses for dissipating heat generated by such devices.

In the electronics and computer industries, it has been well known to employ various types of electronic component packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers.

The aforementioned electronic components are commonly employed in electronic devices, such as computers and cellular phones. These devices are being manufactured smaller and smaller and include faster and faster electronic components therein. As a result, heat generation and overheating continues to be a serious concern while the sizes of the devices get smaller. Therefore, problems arise as to effectively cooling the small electronic components within small and cramped environments within the device. Typical cooling solutions are not preferred because they are large and, as a result, consume large spaces within an already cramped electronic device case. Also, these small devices, such as a cellular phone or laptop computer, must address the competing demands of high power requirements, smaller battery sizes and associated power limitations and overall device case size. Therefore, active cooling solutions, such as powered fans and the like, are not desirable.

Moreover, electromagnetic interference shielding is also often required to ensure proper operation of the electronic device. However, the use of EMI shielding, which typically encases the electronic component within the device to be protected, obstructs proper installation and use of effective solutions for cooling the same electronic component. Therefore, there are competing needs for EMI shielding and effective thermal solutions within electronic devices, particularly in device cases where space is at a premium.

In view of the foregoing, there is a demand for an electronic device case that has a low profile and is net-shape moldable from a thermally conductive material so complex geometries for optimal cooling configurations can be achieved. There is also a demand for an electronic device case that provides passive heat dissipation for a heat generating electronic component to be cooled. There is further demand for an electronic device case to provide both EMI shielding and superior heat dissipation.

SUMMARY OF THE INVENTION

The present invention preserves the advantages of prior art heat sink assemblies for electronic devices and cases for such devices. In addition, it provides new advantages not found in currently available assemblies and overcomes many disadvantages of such currently available assemblies.

The invention is generally directed to the novel and unique electronic device case that includes an improved heat dissipating system for cooling heat generating devices and circuit boards housed therein. The case of the present invention enables the cost-effective cooling of electronic devices while realizing superior thermal conductivity and improved electromagnetic shielding.

In accordance with the present invention, a case for dissipating heat from an electronic device is provided. The case includes an electronic circuit board with a heat generating electronic component installed thereon. A shield is positioned over the electronic component to protect it from electromagnetic interference. The shield includes an aperture through its top surface. A heat transfer conduit is molded into and through the aperture to contact the top surface of the heat generating electronic component. Outer housing, which is made of a thermally conductive material, is place into contact with the top surface of the heat transfer conduit which extends outside the shield so that heat may be dissipating from the electronic component and through the housing via the heat transfer conduit while shielding the electronic component from electromagnetic interference.

The preferred embodiment of the present invention is assembled by routing an aperture through a shield that is positioned over an electronic component installed on a circuit board within the electronic device. The shield acts as a shroud around the electronic component to shield it from electromagnetic interference (EMI). However, such a shield effectively encases the electronic component making access thereto for dissipating heat very difficult, if not impossible. For example, an EMI shield makes the attachment of a heat sink assembly to the electronic component very difficult. Further, the EMI shield encasement prevents air flow to the electronic component for cooling.

A heat transfer conduit is molded into and through the aperture in the EMI shield using a thermally conductive composition, preferably a polymer composite material that is net-shape and injection moldable. The heat transfer conduit is molded to be long enough to extend through the aperture in the EMI shield to communicate with the top surface of the heat generating electronic component. The opposing end of the heat transfer conduit extends outside the EMI shield for exposure to air, such as convecting air within a computer case. The housing of the computer case is also thermally conductive and is preferably positioned to contact the end of the heat transfer conduit that extends outside of the EMI shield to further transfer and conduct the heat from the electronic component.

The present invention may alternatively include a thermally conductive housing that directly contacts the heat generating component within an electronic device case to enhance cooling thereof. Further, raised structures or protrusions on housing may also be employed to ensure thermal contact between the thermally conductive housing and the heat generating electronic component.

It is therefore an object of the present invention to provide an electronic device case that enhances the dissipation of heat from a heat generating electronic component housed therein.

It is an object of the present invention to provide an electronic device case that directly provides heat dissipation for a heat generating electronic component housed therein.

It is a further object of the present invention to provide an electronic device case that passively provides heat dissipation for a heat generating electronic component housed therein.

Another object of the present invention is to provide an electronic device case that simultaneously provides electromagnetic shielding and heat dissipation for an electronic component.

It is a further object of the present invention to provide an electronic device case that is injection moldable of a thermal composite material into complex geometries to enhance thermal dissipation.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

DETAILED DESCRIPTION OF THE PREFERRED EMBODIMENT

For illustration purposes only and by way of example, the present invention is shown to be employed for a laptop computer. A will be seen below, the electronic device case of the present invention can be easily employed in other electronic device cases, such as cellular phones and personal digital assistants, for example. The invention will be described in detail below in the context of an application for a laptop computer, however, such disclosure is not intended to limit the scope of the present invention to such an application of the present invention.

Figure 1:
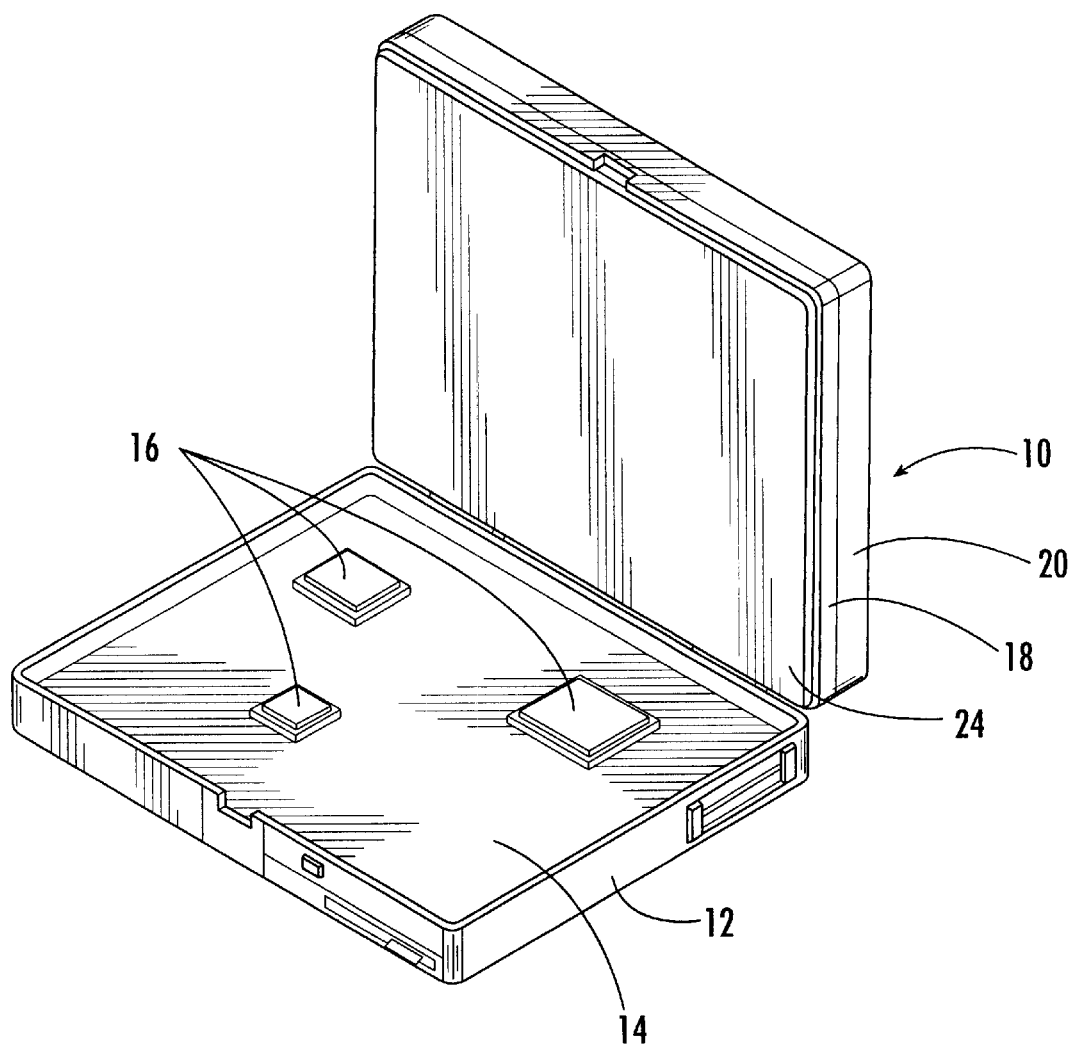
FIG. 1 is a perspective view of a first embodiment of the electronic device case of the present invention with the case in an open position.
Figure 2:
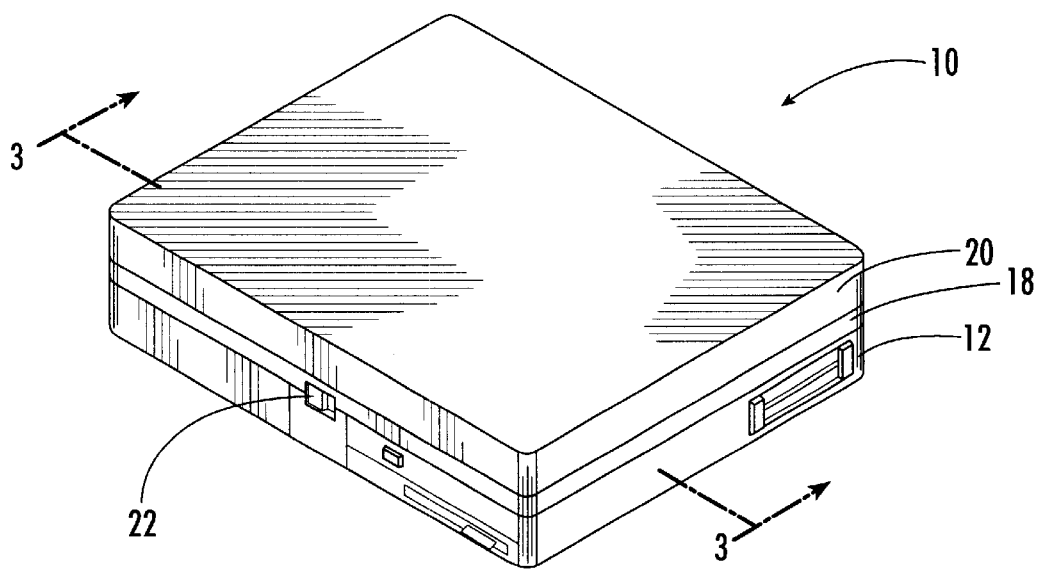
FIG. 2 is a perspective view of the case of FIG. 1 in a closed position.
Figure 3:
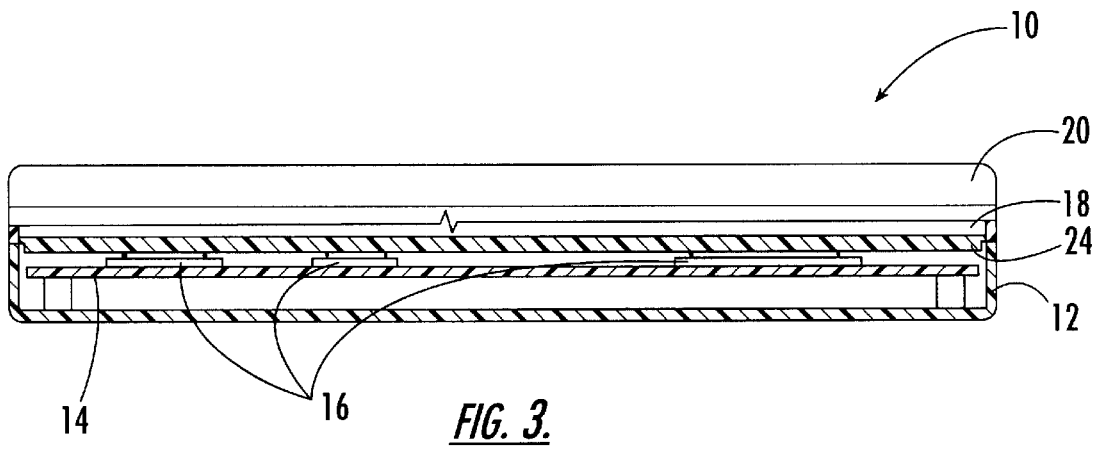
FIG. 3 is a cross-sectional view through the line 3—3 of FIG. 2.

A first embodiment of the present invention is shown in FIGS. 1–3. In FIG. 1, a perspective view of the first embodiment is shown to include an electronic device 10 that has a hinged construction and is in the form of a laptop computer 10. The laptop computer 10 includes a base housing 12 with a circuit board 14 installed therein. A number of heat generating electronic components 16, such as microprocessors and RAM chips, are installed thereon. As will be shown in detail below, the electronic device case 10 of the present invention provides a thermal cooling solution for these electronic components 16 without effecting the operation of the laptop computer 10. Further, a keyboard 18 and monitor 20, such as an active-matrix display, are hingedly connected to the base 12 of the laptop computer 10. The keyboard 18, including a lower thermal contact pad 24, closes down upon the circuit board 14 and electronic components 16 thereon to provide a main housing of the laptop computer 10. The keyboard 18 is retained in a closed position over the circuit board 14 by a latch 22 for normal use of the laptop computer 10. For access to the circuit board 14, for repair for example, the keyboard 18 may be raised. During normal operation of the laptop computer 10, the monitor 20 is frequently pivoted from a closed position during non-use to an open position during use of the laptop computer 10. FIG. 2 illustrates the laptop computer 10 in a closed positioned with keyboard 18 latched to the base 12 and the monitor 20 in a closed position.

Referring now to FIG. 3, in accordance with the present invention, the keyboard 18 and specifically thermal contact pad 24 is used as a heat dissipating structure within the laptop computer 10. More specifically, the thermal contact pad 24 of the keyboard 18 is manufactured of a thermally conductive material. Preferably, the keyboard, at least the bottom portion known as the thermal contact pad 24, is manufactured from a thermally conductive net-shape molded polymer composition. The thermal contact pad 24 keyboard 18 is net-shape molded which means that after the keyboard 18 and thermal contact pad 24 is molded, such as by injection molding, further maching of the part is not necessary because it has been molded into its final shape and configuration as actually used. The polymer composition that is preferred includes a polymer base matrix such as a liquid crystal polymer. The polymer is preferably loaded with thermally conductive filler, such as carbon fiber, copper flakes, boron nitride powder, and the like.

In FIG. 3, the thermally conductive keyboard 18, including thermal contact pad 24, when in its closed position, contacts the top surfaces of the electronic components 16 installed on the circuit board. As a result, heat generated from the electronic components 16 dissipate through the underside of the keyboard 18, namely thermal contact pad 24 and out through the body of the case of the laptop computer 10, such as through the base 12. As a result, passive thermal dissipation of heat from electronic components 16 within an electronic device 10 can be achieved.

Figure 4:
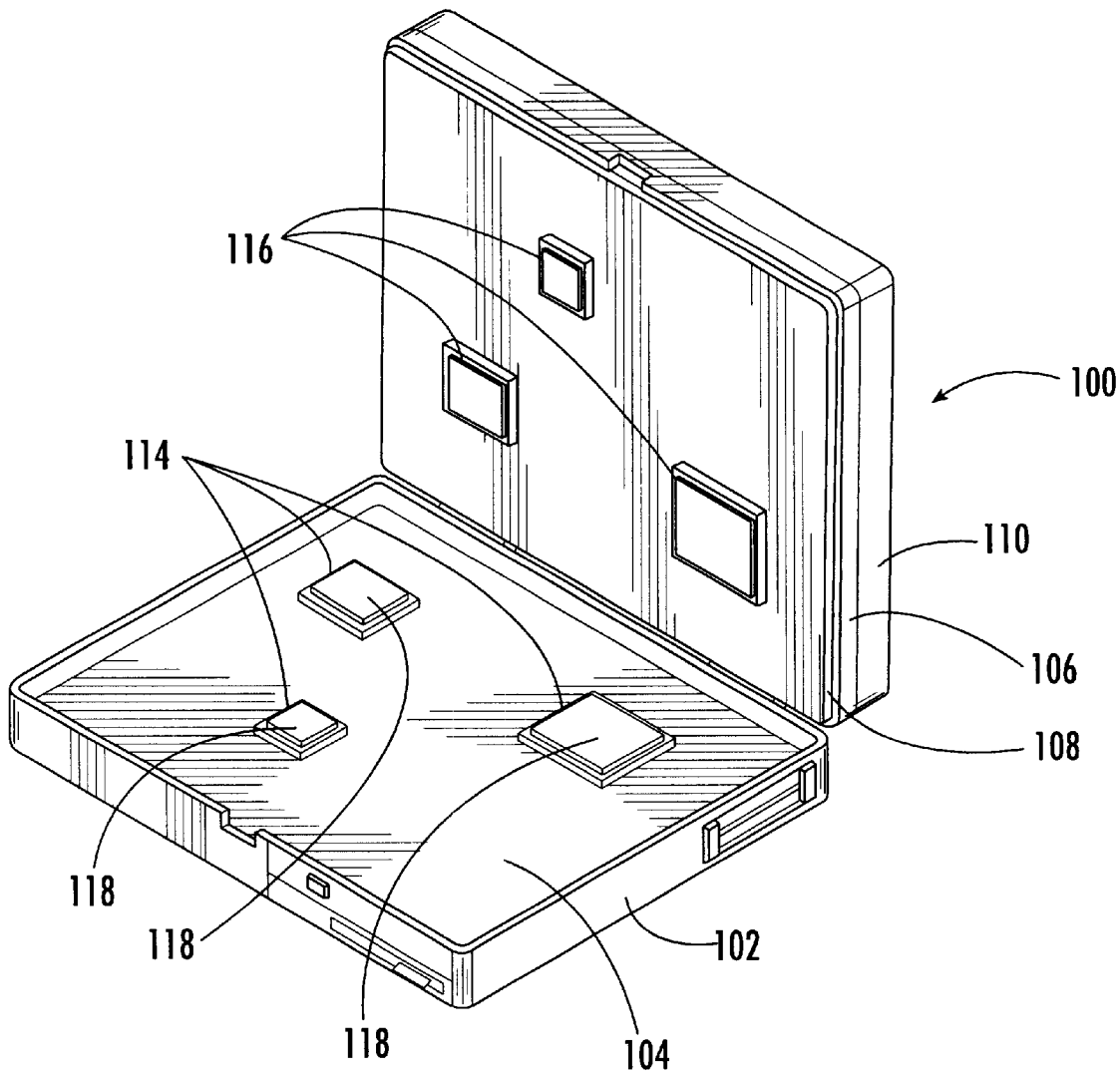
FIG. 4 is a perspective view of a second embodiment of the electronic device case of the present invention with the case in an open position.
Figure 5:
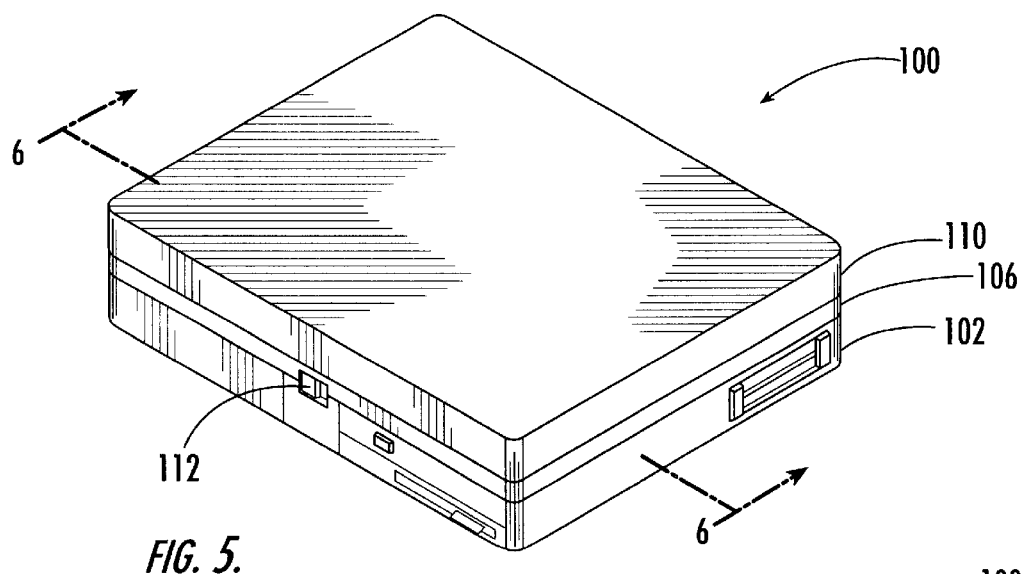
FIG. 5 is a perspective view of the case of FIG. 4 in a closed position.

Turning now to FIGS. 4–7, a second embodiment of the present invention is shown to further enhance the thermal communication between an electronic device case and electronic components residing therein on a circuit board. In FIG. 4, a laptop device configuration 100 is shown to include a base 102 with a circuit board 104 installed therein. A keyboard 106 with a thermal contact pad 108 of a thermally conductive material, as described above, is hingedly connected thereto to provide easy access for repairs and the like. A monitor 110 is also hingedly connected to the base 102 of the laptop computer 100. In similar fashion to the first embodiment, the keyboard 106 and thermal contact pad 108 are secured to the base 102 to enclose the circuit board 104 and electronic components 114 thereon by a latch 112. In FIG. 5, the laptop computer 100 is shown in a completely closed configuration.

Figure 6:
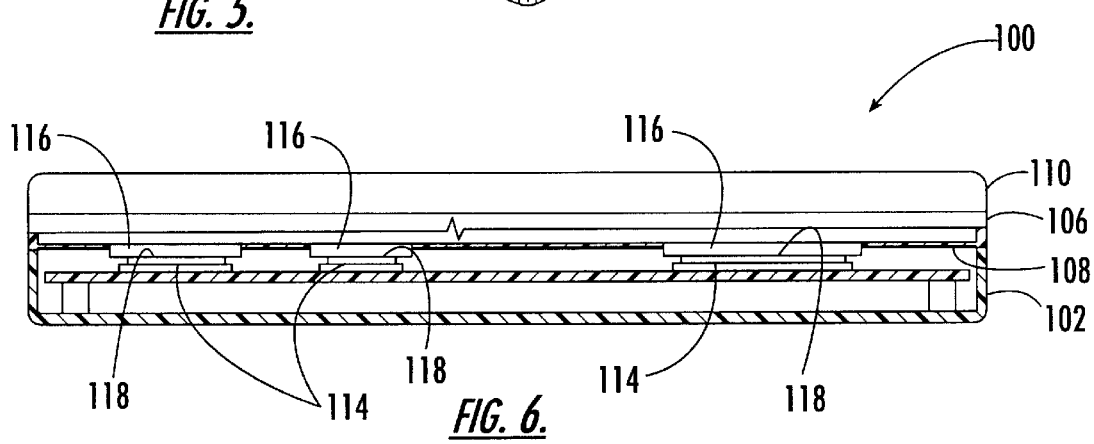
FIG. 6 is a cross-sectional view through the line 6—6 of FIG. 5.
Figure 7:
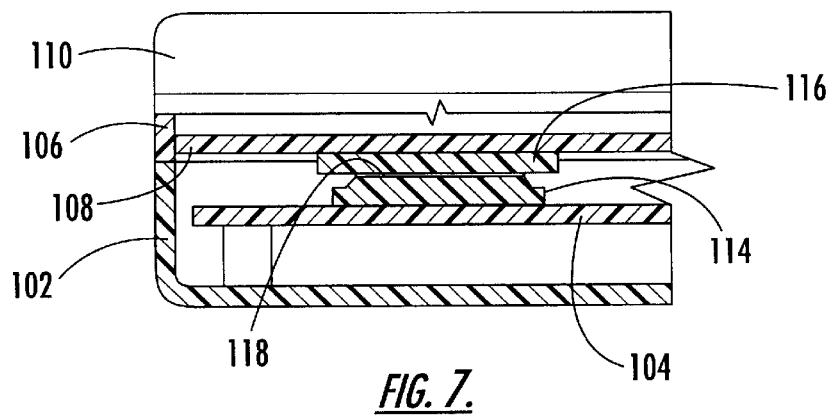
FIG. 7 is a close-up cross-sectional view of FIG. 6.

Referring to FIGS. 4, 6 and 7, there is shown a modified construction for keyboard 106 and thermal contact pad 108 where additional raised structures or protrusions 116 are provided to emanate downwardly from the thermal contact pad 108 to contact the top surfaces 118 of the heat generating electronic components 114. These protrusions 116 may be integrally formed with the bottom surface of the thermal contact pad 108 of the keyboard 106 or may be affixed thereon by a thermal adhesive, or the like. The protrusions 116 are arranged in a mirror pattern of the electronic components 114 on the circuit board 104 so that they complementarily mate when the keyboard 106 is closed.

In a given electronic device environment, the outer housing of the case may be positioned a distance from the top surfaces from the electronic components. Or, the electronic components 114 installed on a circuit board 104 may be of different heights thus necessitating a profile adjustment to the bottom the keyboard 106 and thermal contact pad 108. In the second embodiment 100, the protrusions 116 emanating downwardly from the thermal contact pad 108 on keyboard 106 effectively bridge the gap from the thermal contact pad 108 to the heat generating component 114 itself. Further, these protrusions 116 can be customized to suit the application at hand and can be adjusted to provide the requisite contact pressure to ensure efficient thermal communication when the keyboard of the laptop 100 is closed. For example, if a cellular phone case (not shown) employs the present invention, the fastening of a thermally conductive back plate (not shown) to enclose the device provides the necessary thermal communication between the heat generating electronic component and the thermally conductive back plate.

In FIGS. 8–11, a third and preferred embodiment of the present invention is shown and generally referenced as 200. Similar to the first and second embodiments above, the third embodiment 200 illustrates a number of electronic components 202 installed on a circuit board 204 within a laptop computer 200. However, this third embodiment 200 also includes a metallic shroud 206, such as a nickel coated aluminum shell, which is employed for EMI shielding. As discussed above, EMI shielding is frequently required to ensure that the electronic component 202 and, therefore, the entire electronic device 100 operates properly. Details of the operation of an EMI shield need not be discussed herein because such EMI shielding methods are well known. As can be understood, the positioning of a EMI shield 206 about electronic components 202 also prevents access to the electronic components 202 for thermal solutions, such as heat sinks and other cooling solutions. Moreover, encasing the electronic components within an EMI shield 206 prevents exposure of the electronic components 202 to air within a case which is a common method for cooling electronic components 202.

Figure 8:
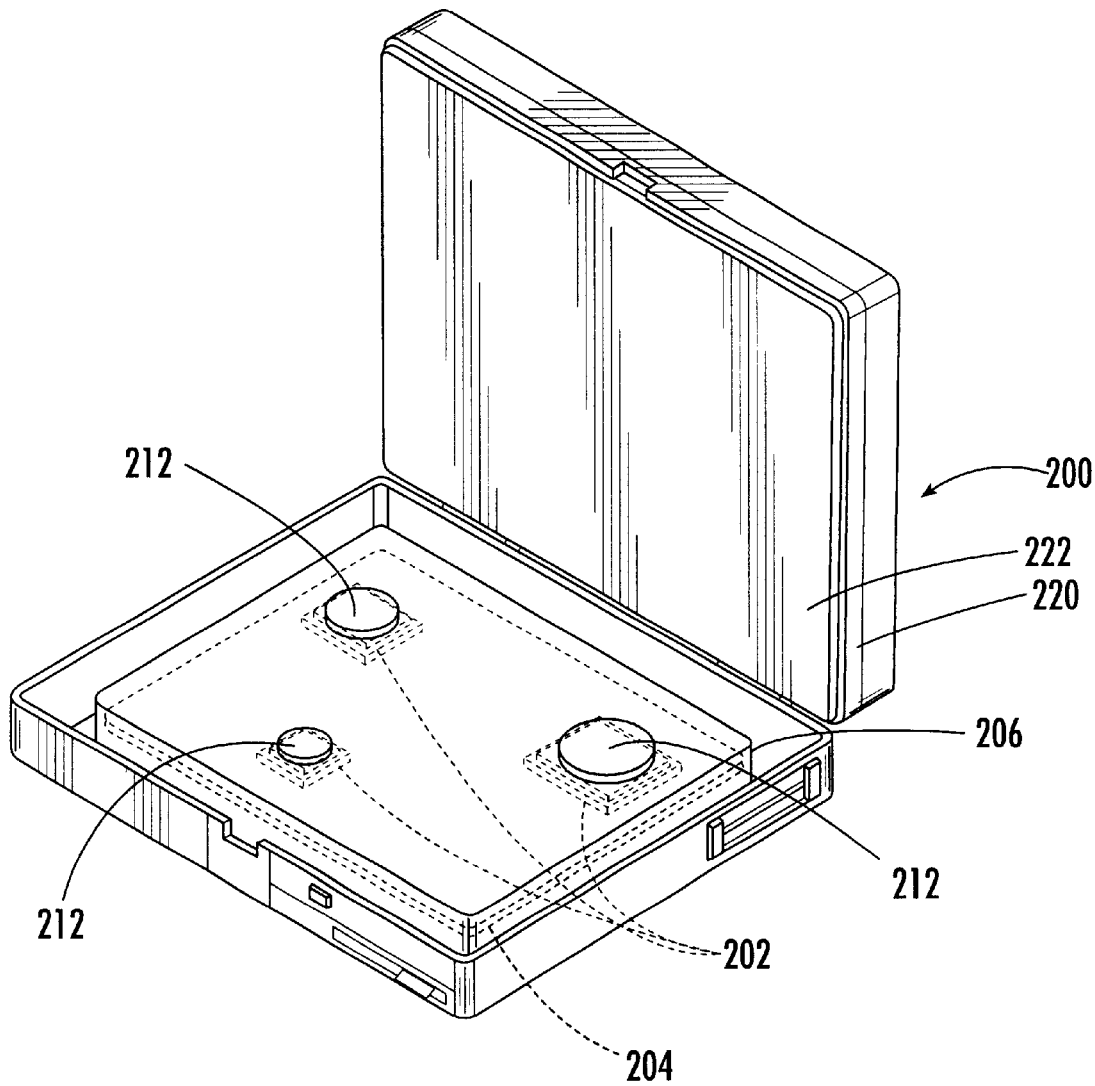
FIG. 8 is a perspective view of a third and preferred embodiment of the electronic device case of the present invention with the case in an open position.
Figure 9:
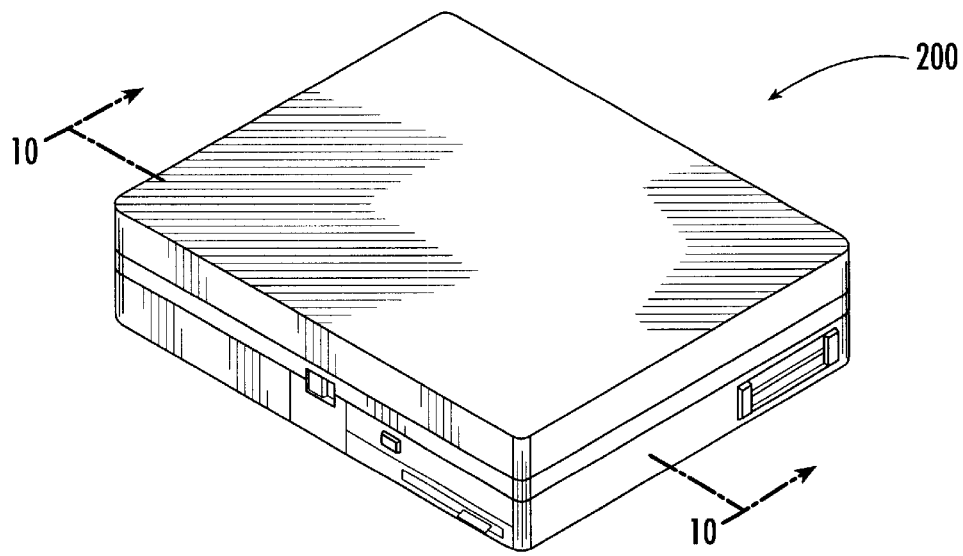
FIG. 9 is a perspective view of the case of FIG. 8 in a closed position.
Figure 10:
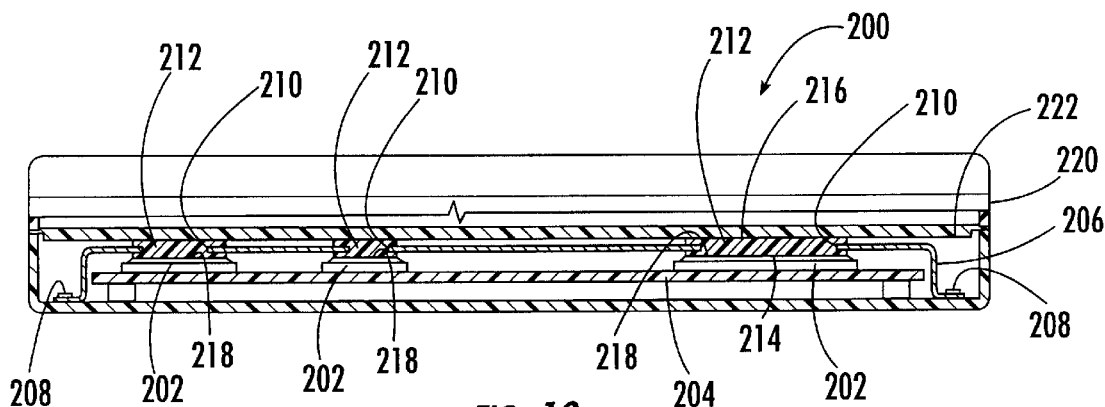
FIG. 10 is a cross-sectional view through the line 10—10 of FIG. 9.
Figure 11:
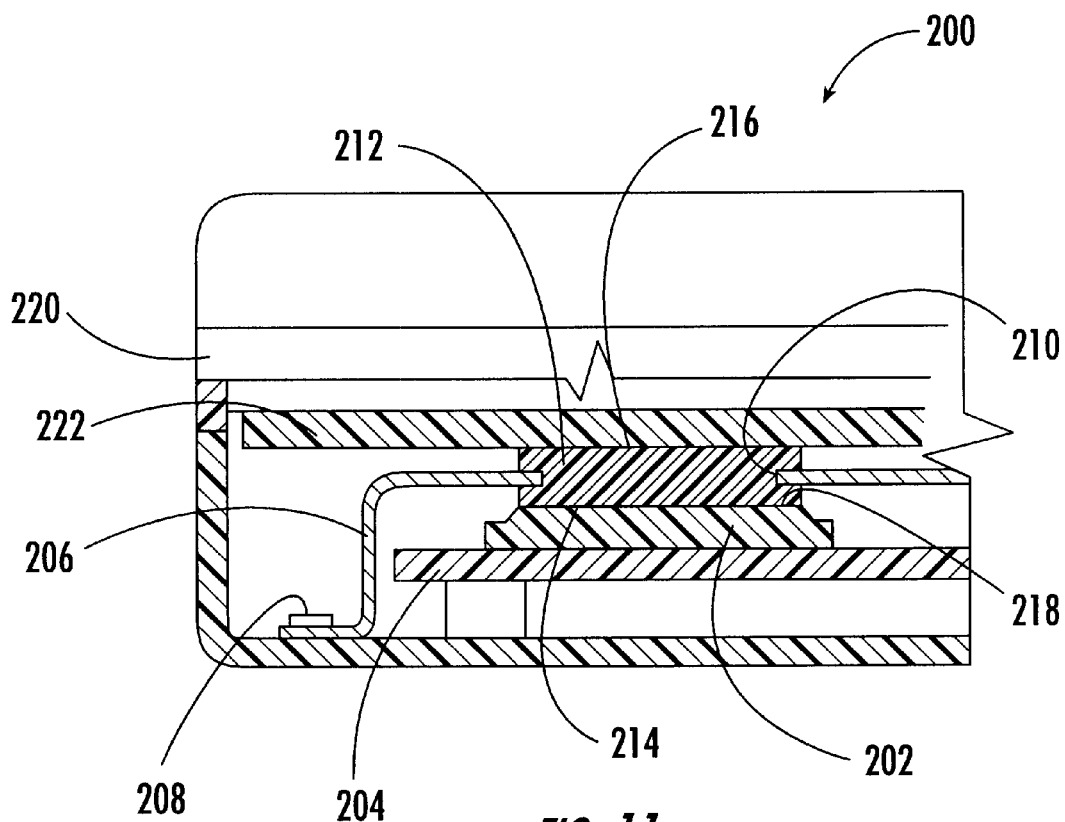
FIG. 11 is a close-up cross-sectional view of FIG. 10.

As best seen in FIGS. 8, 10 and 11, an EMI shield 206 is provided over the electronic components 202 and secured to the circuit board 204, by, for example, fasteners 208. The EMI shield 206, in accordance with the present invention, includes a number of apertures 210 at locations positioned directly above each of the electronic components to be cooled. The apertures 210 may be formed of the desired size by stamping, die-cutting, drilling or the like. In the third and preferred embodiment 200, a total of three electronic components 202 are shown by way of example with corresponding apertures 210 through the EMI shield 206. Each aperture 210 in the EMI shield 206, is provided with a heat transfer conduit 212 by overmolding thermally conductive material in and therethrough. Each heat transfer conduit 212 is preferably injection molded with a thermally conductive polymer composite, as described above. The heat transfer conduits are preferably permanently installed through their respective apertures 210 in the EMI shield 206. Each heat transfer conduit 212 has a given length with a bottom contact surface 214 and a top contact surface 216. The sizes and configurations of the heat transfer conduits 212 can be customized to accommodate the size and configuration of the corresponding electronic component 202. When the EMI shield 206 is affixed to the circuit board 204, the heat transfer conduits 212 communicate with their corresponding electronic component 202 with the bottom surface 214 of the heat transfer conduits 212 contacting the respective top heat generating surfaces 218 of the electronic components 202 to be cooled.

The employment of the heat transfer conduits 212 effectively conducts heat from the electronic components 202 to a position outside of the EMI shield 206 for further transfer and dissipation. The heat transfer conduits 212 provide a highly thermally conductive passageway for directing heat through the EMI shield 206. In the preferred embodiment 200, closing of the keyboard 220 effectively bridges the thermal contact pad 222 with the top surfaces 216 of each of the heat transfer conduits 212 to further dissipate heat away from the heat generating electronic components 202. It is within the scope of the present invention to alternatively provide the top surface 216 of the heat transfer conduits 212 with a grooved or finned configuration (not shown) to provide heat dissipating without thermal communication with the thermal contact pad 222 attached to the keyboard 220. With the present invention, simultaneous EMI shielding and heat dissipation of the same group of electronic components 202 can be achieved which was not possible in prior art electronic device cases.

It is preferred that the heat transfer conduits 212 and thermal contact pads 24, 108 and 222 be manufactured from a unitary molded member of a thermally conductive polymer or the like. For example, a polymer base matrix loaded with conductive filler material, such as PITCH carbon fiber, may be employed as the material for the present invention. Such unitary construction and direct overmolding is unlike that found in the prior and provides significant advantages including low cost, ease of manufacture and flexibility of heat geometry due to the ability to mold the assembly as opposed to machining it.

It would be appreciated by those skilled in the art that various changes and modifications can be made to the illustrated embodiments without departing from the spirit of the present invention. All such modifications and changes are intended to be covered by the appended claims.

What is claimed is:

1. A case for dissipating heat from an electronic device, comprising:
   an electronic circuit board;
   a heat generating electronic component disposed on said circuit board; and
   a housing positioned about said electronic circuit board and said heat generating electronic component; said housing being made of a net-shaped moldable thermally conductive composite material of a polymer base matrix with thermally conductive filler therein; said housing being in thermal communication with said electronic component with heat being dissipating from said heat generating electronic component and through said housing.

2. The case of claim 1, wherein said housing is injection molded.

3. The case of claim 1, wherein said heat generating electronic component is a semiconductor device.

4. A case for dissipating heat from an electronic device, comprising:

an electronic circuit board;

a heat generating electronic component disposed on said circuit board;

a housing positioned about said electronic circuit board and said heat generating electronic component; said housing being of a net-shaped moldable thermally conductive composite material of a polymer base matrix with thermally conductive filler therein;

a protrusion emanating from said housing corresponding and aligned with said heat generating electronic component; said protrusion emanating from said housing; and said protrusion being in thermal communication with said electronic component with heat being dissipating from said heat generating electronic component and through said housing via said protrusion.

5. The case of claim 4, wherein said housing is injection molded.

6. The case of claim 4, wherein said heat generating electronic component is a semiconductor device.

7. A case for dissipating heat from an electronic device, comprising:

an electronic circuit board;

a heat generating electronic component, having a top surface, disposed on said circuit board;

an electromagnetic interference shield positioned on said electronic circuit board with said heat generating electronic component residing therebetween; said electromagnetic interference shield including a top surface with an aperture therethrough;

a heat transfer conduit molded into and through said aperture; said heat transfer conduit being made of a thermally conducive material and having a top surface and a bottom surface;

a housing, being made of a net-shaped moldable thermally conductive composite material of a polymer base matrix with thermally conductive filler therein, being in thermal communication with said top surface of said heat transfer conduit; said bottom surface of said heat transfer conduit being in thermal communication with said top surface of said heat generating electronic component;

whereby heat is dissipated from said from said heat generating electronic component via said heat transfer conduit through said electromagnetic interference shield and out said housing while said electromagnetic interference shield protects said heat generating electronic component from electromagnetic interference.

8. The case of claim 1, wherein said housing and said heat transfer conduit are injection molded.

9. The case of claim 1, wherein said heat generating electronic component is a semiconductor device.

* * * * *